United States Patent
Chen et al.

(10) Patent No.: US 9,818,858 B1
(45) Date of Patent: Nov. 14, 2017

(54) MULTI-LAYER ACTIVE LAYER HAVING A PARTIAL RECESS

(71) Applicant: Taiwan Semiconductor Manufacturing Co., Ltd., Hsin-Chu (TW)

(72) Inventors: Chi-Ming Chen, Zhubei (TW); Chung-Yi Yu, Hsin-Chu (TW); Kuei-Ming Chen, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/231,911

(22) Filed: Aug. 9, 2016

(51) Int. Cl.
*H01L 29/66* (2006.01)
*H01L 29/778* (2006.01)
*H01L 29/04* (2006.01)
*H01L 21/768* (2006.01)

(52) U.S. Cl.
CPC .... *H01L 29/7787* (2013.01); *H01L 21/76871* (2013.01); *H01L 29/045* (2013.01); *H01L 29/66431* (2013.01)

(58) Field of Classification Search
CPC ........... H01L 29/7787; H01L 21/76871; H01L 29/045; H01L 29/66431
See application file for complete search history.

(56) References Cited

U.S. PATENT DOCUMENTS

2015/0060946 A1* 3/2015 Makiyama ............ H01L 29/402
257/194

OTHER PUBLICATIONS

Huang, et al. "Effect of Growth Conditions on the Al Composition and Quality of AlGaN Film." Materials Science and Engineering B 136 (2007) 29-32.

* cited by examiner

*Primary Examiner* — Roy Potter
*Assistant Examiner* — Paul Patton
(74) *Attorney, Agent, or Firm* — Eschweiler & Potashnik, LLC (57) ABSTRACT

A transistor with a multi-layer active layer having at least one partial recess is provided. The transistor includes a channel layer arranged over a substrate. The channel layer has a first bandgap. The transistor includes a first active layer arranged over the channel layer. The first active layer has a second bandgap different from the first band gap such that the first active layer and the channel layer meet at a heterojunction. The transistor includes a second active layer arranged over the first active layer. The transistor also includes a dielectric layer arranged over the second active layer. The transistor further includes gate electrode having gate edges that are laterally adjacent to the dielectric layer. At least one gate edge of the gate edges is laterally separated from the second active layer by a first recess.

20 Claims, 10 Drawing Sheets

MULTI-LAYER ACTIVE LAYER HAVING A PARTIAL RECESS

BACKGROUND

Semiconductor devices based on silicon, such as transistors and photodiodes, have been the standard for the past three decades. However, semiconductor devices based on alternative materials are receiving increasing attention for advantages over silicon-based semiconductor devices. Semiconductor devices based on gallium nitride (GaN) are one example of such semiconductor devices.

GaN-based semiconductor devices have found widespread use in optoelectric applications (e.g., in light emitting diodes) due to the wide band gap of GaN. GaN-based semiconductor devices also offer a potential advantage for use in solar cells where GaN semiconductor devices cover a wide range of photons energies and in high power applications where the high electron mobility and low temperature coefficients of GaN allow it to carry large currents and support high voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. illustrate 18A-B cross-sectional views of some embodiments of a semiconductor structure having a multi-layer active layer having at least one partial recess.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some gallium nitride (GaN) transistors include an epitaxial stack arranged over a silicon substrate. The epitaxial stack includes an aluminum nitride (AlN) seed layer, a high resistivity GaN buffer layer, a GaN channel layer, and a single $Al_xGa_{1-x}N$ active layer stacked in that order. The GaN channel layer and the single $Al_xGa_{1-x}N$ active layer define a heterojunction in which a two-dimensional electron gas (2-DEG) forms in the GaN channel layer. The x of the single $Al_xGa_{1-x}N$ active layer denotes a concentration of the amount of aluminum relative to the total amount of aluminum and gallium. The single active layer typically has a large x value between 0.2-0.5 or a small x value between 0.1-0.2.

While there are distinct advantages to both a large and small x values, there are also disadvantages unique to each. For example, a single $Al_xGa_{1-x}N$ active layer having an x value of greater than 0.23 provides a low drain to source resistance when the current to the GaN transistor is on ($RDS_{on}$) of approximately 2.2 m$\Omega$/cm$^2$. Advantageously, the lower $RDS_{on}$ facilitates current flow in the GaN transistor. The large x value of greater than 0.23 also provides a low dynamic $RDS_{on}$, a ratio between of the $RDS_{on}$ to the static $RDS_{on}$. However, a disadvantage of the large x value is the resulting electric field has a magnitude of about 3.8 MV/cm which reduces functionality at a gate edge of the GaN transistor. Furthermore, the high magnitude electric field corresponding to the large x value can cause device burnout.

The disadvantages of the large x value can be mitigated by using a single $Al_xGa_{1-x}N$ active layer with a smaller x value. For example, a small x value of less than 0.16 corresponds to an electric field having a reduced magnitude of approximately 3.2 MV/cm which diminishes stress at the gate edge thereby decreasing the risk of device burnout. However, the smaller x value has the disadvantage of a higher $RDS_{on}$ and dynamic $RDS_{on}$. For example, the smaller x value of less than 0.16 corresponds to an $RDS_{on}$ of approximately 3.1 m$\Omega$/cm$^2$, which can prevent current flow in the GaN transistor. Therefore, a single $Al_xGa_{1-x}N$ active layer, regardless of the x value, suffers from the disadvantages that correspond to that particular x value.

Yet another challenge with the conventional single $Al_xGa_{1-x}N$ active layer semiconductor structure is that the electric field at the gate edge can cause gate edge failure or even device burn out. Conventionally, the single $Al_xGa_{1-x}N$ active layer is a continuous layer that extends under and laterally abuts the device electrodes, including the source electrode, gate electrode, and drain electrode. The electric field induces stress where the single $Al_xGa_{1-x}N$ active layer abuts a device electrode.

In view of the foregoing, the present application is directed to an improved GaN transistor with a multi-layer active layer structure having a partial recess, and an improved method for manufacturing the GaN transistor. The improved GaN transistor includes an epitaxial stack having multiple (i.e., at least two) active layers stacked between the silicon substrate and the dielectric layer. The active layers may include, for example, AlGaN layers having different concentrations of Al. By using multiple active layers, the GaN transistor benefits from the advantages of the concentrations of the individual active layers. Furthermore, the benefits of one active layer mitigate the disadvantages of another active layer. Moreover, because a plurality of active layers are used, one or more of the active layers can be recessed such that the one or more active layers do not directly abut the device electrodes there by reducing gate edge failure.

Figure 1:
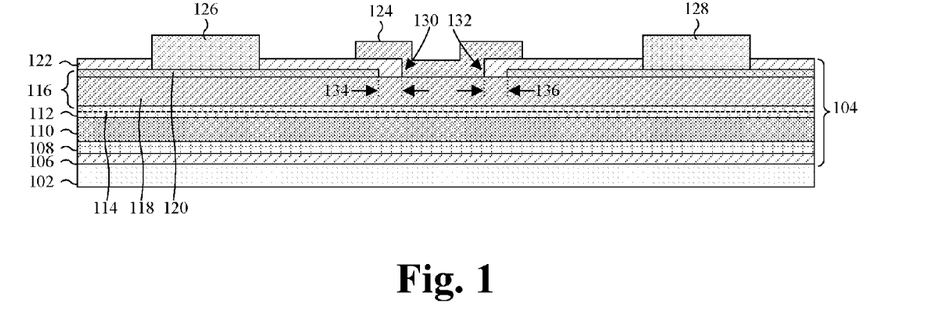
FIG. 1 illustrates a cross-sectional view of some embodiments of a semiconductor structure having a multi-layer active layer having at least one partial recess.

With reference to FIG. 1, a cross-sectional view 100 of some embodiments of a depletion mode high electron mobility transistor (D-HEMT) is shown. The D-HEMT includes a substrate 102 and an epitaxial stack 104 overlying the substrate 102. The substrate 102 typically has crystalline orientation of (111), but other orientations may also be used. Further, the substrate 102 may be, for example, a silicon carbide substrate, a silicon substrate, or a sapphire substrate, and/or may have, for example, a thickness of between about 800-2000 nanometers.

A seed layer 106 of the epitaxial stack 104 is arranged over the substrate 102. The seed layer 106 is employed for growth of a graded buffer layer 108 of the epitaxial stack 104. The seed layer 106 provides a crystalline lattice structure that "seeds" the graded buffer layer 108. Further, in some embodiments, the seed layer 106 is employed to isolate the substrate 102 from an overlying active area of the D-HEMT. The seed layer 106 is typically a group III-V material, such as, for example, aluminum nitride.

The graded buffer layer 108 is arranged over the seed layer 106. In some embodiments, the graded buffer layer 108 may have a carbon or iron dopant concentration of greater than about 1e17 $cm^{-3}$. In some embodiments, the graded buffer layer 108 has a thickness of about 0.5-1.5 micrometers. The relative amounts of the dopant concentrations typically change so as to vertically reduce the lattice constants of the graded buffer layer 108 with distance from the substrate 102. Hence, by "graded", it is meant that the lattice constants and/or dopant concentrations change along the thickness of the graded buffer layer 108. The buffer layer 108 may be, for example, a group III-V material. In one embodiment, the graded buffer layer 108 may include a plurality of layers with increasing or decreasing amounts of an element common to the plurality of layers. For example, the graded buffer layer 108 includes three or four $Al_xGa_{1-x}N$ layers stacked with increasing or decreasing amounts of aluminum and gallium, where x corresponds to an amount of aluminum and gallium.

The epitaxial stack 104 includes a doped buffer layer 110. In some embodiments, the doped buffer layer 110 is a doped GaN layer or other doped group III-V layer. In some embodiments, the dopants are carbon or iron. The dopants may have a concentration of exceeding about 1e19 $cm^{-3}$. The dopants produce the high resistivity, and induce a compressive force. The doped buffer layer 110 may have a thickness of, for example, about 0.5-2.5 micrometers.

A channel layer 112 of the epitaxial stack 104 is arranged over the doped buffer layer 110. The channel layer 112 includes a 2-DEG 114 (demarcated by the dashed line) within which a conductive channel is selectively formed. The 2-DEG 114 has high mobility electrons that are not bound to any atoms and that are free to move within the 2-DEG 114. The channel layer 112 is typically undoped GaN, but other group III-V materials are amenable. For example, the channel layer 112 may, for example, be indium gallium nitride (InGaN). The channel layer 112 may have a thickness of, for example, about 0.2-0.6 micrometers.

A plurality of active layers 116 are arranged over the channel layer 112. The plurality of active layers 116 includes a first active layer 118 and the second active layer 120. The first active layer 118 of the plurality of active layers 116 is arranged directly on top of the channel layer 112, such that the top surface of the channel layer 112 and the bottom surface of the first active layer 118 directly abut each other. In some embodiments, the first active layer 118 has a thickness of 5-30 nanometers. The first active layer 118 includes a material, typically a group III-V material, having a band gap unequal to that of the channel layer 112. For example, where the channel layer 112 is GaN, the first active layer 118 may be AlGaN. AlGaN has a band gap of approximately 4 electron volts (eV), whereas GaN has a band gap of approximately 3.4 eV. The first active layer 118 has first concentration of elements common to the first active layer. For example, in a first active layer 118 of AlGaN, the first concentration is of Al relative to the total amount of Al and Ga.

The second active layer 120 of the plurality of active layers 116 is arranged overlying the first active layer 118. Like the first active layer 118, the second active layer 120 includes a material, typically a group III-V material, having a band gap unequal to that of the channel layer 112. Like the first active layer 118, the second active layer 120 has second concentration of elements common to the first active layer. However, the second active layer 120 has a different concentration as compared to the first active layer 118. While a first active layer 118 and a second active layer 120 are described, more active layers may be used.

A dielectric layer 122 is arranged over the plurality of active layers 116, and a gate electrode 124 and source/drain electrodes 126, 128 are arranged over the dielectric layer 122. The dielectric layer 122 may be, for example, an oxide, such as silicon dioxide, or a nitride, such as silicon nitride. The source/drain electrodes 126, 128 are arranged on opposing sides of the gate electrode 124. In some embodiments, the gate electrode 124 is arranged over the first active layer 118 at a position between the source region (associated with source electrode 126) and the drain region (associated with drain electrode 128). The gate electrode 124 including a lower gate electrode portion and upper gate electrode portions which extend laterally from an uppermost portion of the lower gate electrode portion.

Further, the source/drain electrodes 126, 128 extend through the dielectric layer 122 to at least one of the plurality of active layers 116. The gate electrode 124 and the source/drain electrodes 126, 128 may be a conductive material, such as metal or doped polysilicon.

As discussed above, the second active layer 120 overlies the first active layer 118 and underlies the gate electrode 124 and the source/drain electrodes 126/128. The gate electrode 124 has gate edges including a first gate edge 130 and a second gate edge 132. In some embodiments, the second active layer 120 is separated from at least one of the gate edges. In some embodiments, the second active layer 120 is separated from the first gate edge 130 by a first recess 134, and the second active layer 120 is separated from the second gate edge 132 by a second recess 136. The first recess 134 has a length corresponding to a first distance and the second recess 136 has a length corresponding to a second distance. In some embodiments, first distance is proportional to the distance between the source electrode 126 and the gate electrode 124 and the second distance is proportional to the distance between the date electrode 124 and the drain electrode 128. In some embodiments, the second distance is longer than the first distance. For instance, the first distance can range from 0-2 micrometers, and the second distance can range from 2-10 micrometers in some embodiments. Therefore, having a plurality of active layers allows one layer of the multi-layer active layer to be recessed to reduce stress at the gate edges 130, 132 of the gate electrode 124. In addition to allowing at least one active layer to be recessed, having multiple active layers can be used to mitigate the disadvantages of the individual active layers.

Suppose that the first active layer 118 and the second active layer 120 are comprised of AlGaN. The first active layer 118 may be an $Al_xGa_{1-x}N$ layer, where x corresponds to the amount of aluminum relative to the total amount of aluminum and gallium. In one embodiment, x may be in a range of 0.1-0.2. The value x may be selected for specific field effects. For example, the first active layer 118 may be $Al_{0.16}Ga_{0.84}N$ which corresponds to a lower magnitude electric field at gate edges 130, 132 of the gate electrode 124 thereby reducing device burn out. However, x=0.16 also corresponds to a high drain to source resistance between the drain electrode 128 and the source electrode 126 when the current is on ($RDS_{on}$). To take advantage of the lower electric field at the gate edge but compensate for the high $RDS_{on}$ a complementary concentration may be selected for the second active layer 120.

Suppose that the second active layer 120 is an $Al_yGa_{1-y}N$ layer, where y corresponds to the amount of aluminum relative to the total amount of aluminum and gallium. In one embodiment, y may be in a range of 0.2-0.5. The value y may be selected for specific field effects itself or to compliment the field effects of another active layer in the plurality of active layers 116, such as first active layer 118. For example, the second active layer 120 may be $Al_{0.23}Ga_{0.77}N$ which corresponds to a lower $RDS_{on}$ that mitigates the high $RDS_{on}$ of the first active layer 118. However, y=0.23 also has a high electric field that can induce device burn out. The high electric field of the second active layer 120 is mitigated by the lower electric field of the first active layer 118. Accordingly, the first active layer 118 and the second active layer 120 have complimentary effects.

The complimentary effects of the first active layer 118 and the second active layer 120 mitigate the disadvantages of the active layers individually. Therefore, by combining multiple active layers the transistor takes advantage of the individual benefits while not suffering the disadvantages. For example, suppose that the first active layer 118 has a low concentration, x=0.16, and the second layer has a high concentration, y=0.32. The resulting E field has a magnitude of 3.2 MV/cm at the gate edge which diminishes the risk of device burnout. Furthermore, the transistor benefits from a low $RDS_{on}$ of approximately 2.2 mΩ/cm$^2$, which facilitates current flow. Accordingly, the multiple active layers have a synergistic effect that allows the transistor to benefit from the advantages of the individual active layer.

Figure 2:
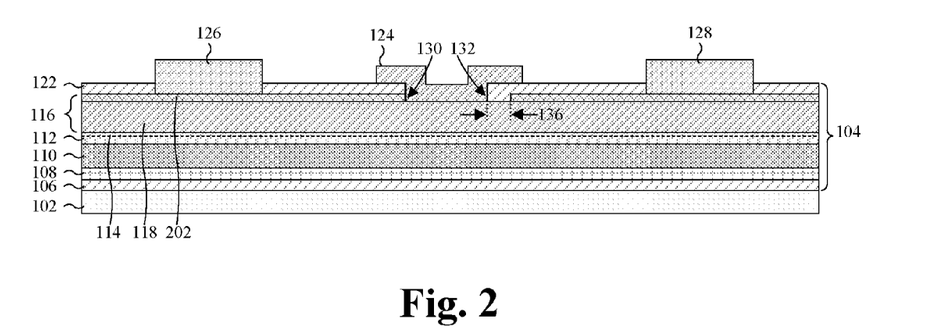
FIG. 2 illustrates a cross-sectional view of other embodiments of a semiconductor structure having a multi-layer active layer having at least one partial recess.

With reference to FIG. 2, a cross-sectional view 200 of some additional embodiments of a D-HEMT is provided. The D-HEMT of FIG. 2 includes a similar structure as the D-HEMT of FIG. 1, except it includes a different second active layer 202. The second active layer 202 is arranged over the first active layer 118 and abuts the first gate edge 130. Accordingly, rather than there being a recess between the second active layer 202 and the first gate edge 130, the second active layer 202 is in direct contact with the first gate edge 130. The second active layer 202 is separated from the second gate edge 132 by the second recess 136. Accordingly, fewer recesses in the second active layer 202 may be used.

Figure 3:
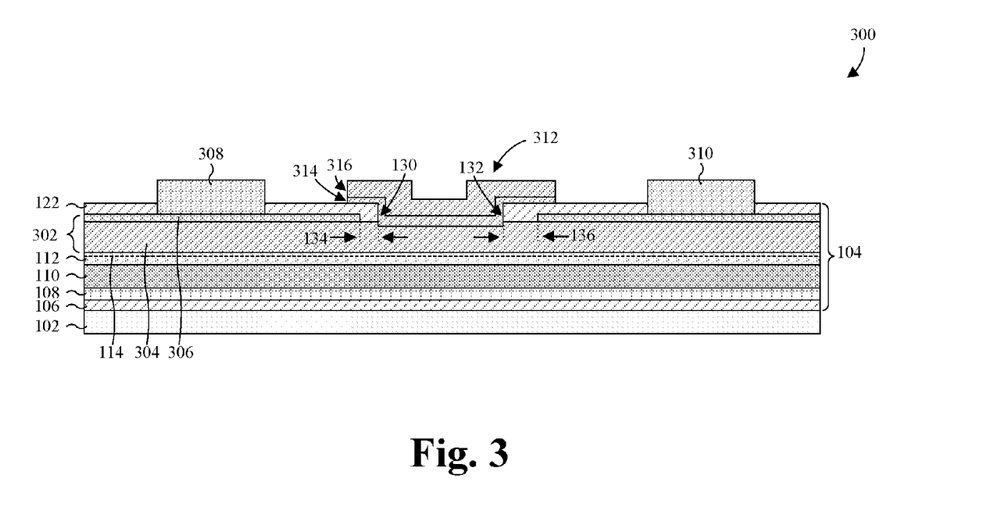
FIG. 3 illustrates a cross-sectional view of yet other embodiments of a semiconductor structure having a multi-layer active layer having at least one partial recess.

With reference to FIG. 3, a cross-sectional view 300 of some embodiments of a depletion mode metal-insulation-semiconductor field-effect transistor (D-MISFET) with a multi-layer active layer having a partial recess is provided. The D-MISFET includes a similar structure as the D-HEMT of FIG. 1, except it includes a different multi-layer active layer and different gate and source/drain structures. A multi-layer active layer structure 302 includes a first active layer 304 arranged over the channel layer 112, and a second active layer 306 arranged over the first active layer.

The first active layer 304 may include a single group III-V layer, such as, for example, an $Al_xGa_{1-x}N$ layer. The first active layer 304 may be, for example, about 2-10 nanometers thick. Alternatively, the second active layer 306 may a single group III-V layer, such as, for example, an $Al_yGa_{1-y}N$ layer. The second active layer 306 may have a thickness of, for example, about 5-30 nanometers. In some embodiments, the first active layer 304 and/or the second active layer 306 may be a multilayer stack of doped group III-V layers.

Source/drain electrodes 308, 310 are arranged over the second active layer 306 and extend into the first active layer 304 or into the channel layer 112. Further, a gate electrode 312 is arranged over the second active layer 306 and extends into the first active layer 304. The gate electrode 312 includes a passivation layer 314 and a gate conductive layer 316. The passivation layer 314 may be an insulator (e.g., $Si_3N_4$). The gate conductive layer 316 may be a conductive material, such as metal (e.g., TiN). The source/drain electrodes 308, 310 may be, for example, a conductive material, such as metal or doped polysilicon.

Figure 4:
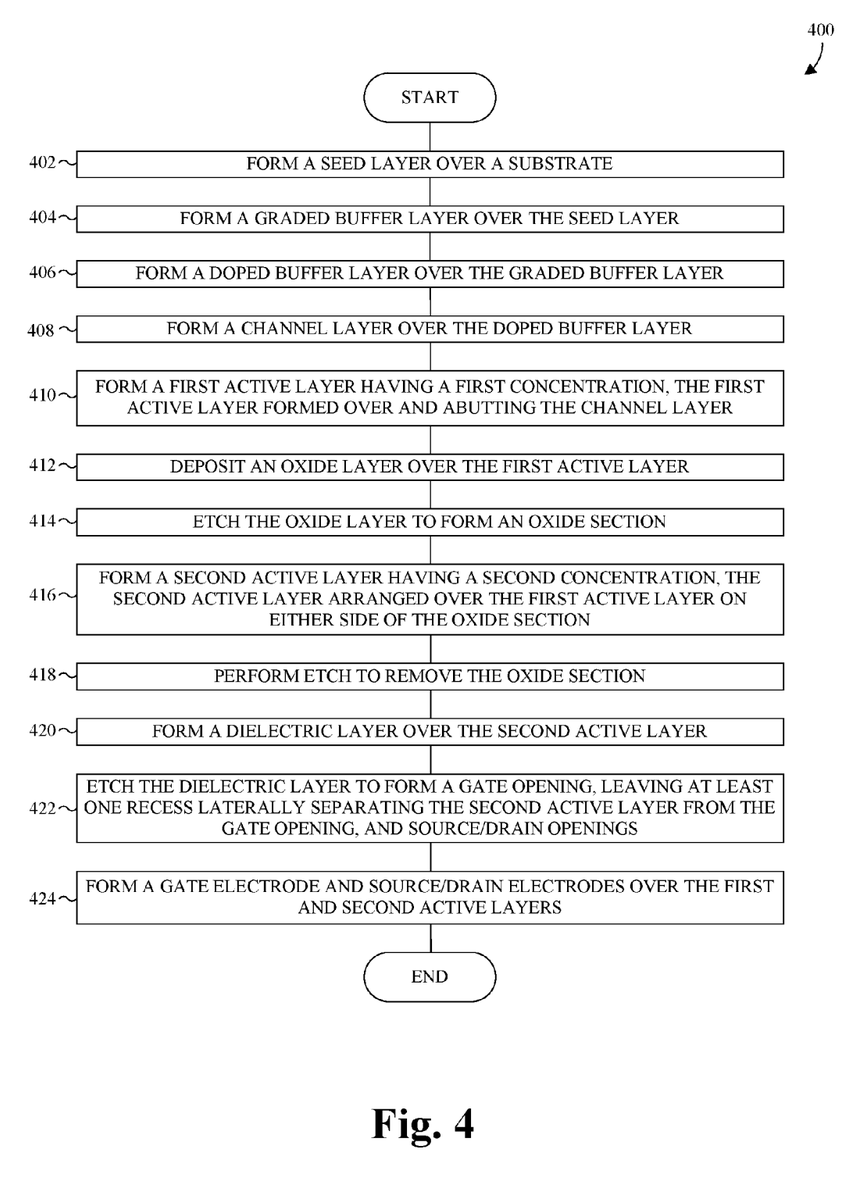
FIG. 4 illustrates a flowchart of some embodiments of a method for manufacturing a semiconductor structure having a multi-layer active layer having at least one partial recess.

With reference to FIG. 4, a flowchart 400 of some embodiments of a method for manufacturing a GaN transistor with a multi-layer active layer structure is provided. The GaN transistor may be, for example, an E-MISFET, a D-MISFET, or an D-HEMT.

At 402, a seed layer is formed over a substrate.

At 404, a graded buffer layer is formed over the seed layer.

At 406, a doped buffer layer is formed over the graded buffer layer.

At 408, a channel layer is formed over the doped buffer layer.

At 410, a first active layer is formed over the channel layer. The first active layer is formed to have a first concentration of aluminum relative to the total amount of aluminum and gallium.

At 412, an oxide layer is deposited over the first active layer.

At 414, the oxide layer is etched to form an oxide section.

At 416, a second active layer is formed over the first active layer on either side of the oxide section. The second active layer is formed to have a second concentration of aluminum relative to the total amount of aluminum and gallium. The second concentration may be selected based, at least in part, on the first concentration to generate a predetermined electrical effect such as an electric field having a desired magnitude and/or $RDS_{on}$ value for the combined active layers.

At 418, the oxide section is etched to remove the oxide section.

At 420, a dielectric layer is formed over the second active layer.

At 422, the dielectric layer is etched to form electrode openings, such as a gate opening, for the source/drain and gate electrodes.

At 424, a gate electrode and source/drain electrodes are formed over the first and second active layers. In some embodiments, the gate electrode and source/drain electrodes are seated within one or more of the active layers. The gate electrode is positioned to be laterally separated from the second active layer by the at least one recess.

Advantageously, the multi-layer active layers reduce the effects of the active layers individually. Accordingly, the GaN transistor benefits from active layers collectively. For example, the collective active layers reduce gate burnout while lowering the $RDS_{on}$. Furthermore, the second active layer can be recessed so that it does not directly abut the gate electrode to further reduce gate edge failure.

While the method described by the flowchart 400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 5-15, 16A-B, and 17A-C cross-sectional views of some embodiments of a GaN transistor with a multi-layer active layer having at least one partial recess at various stages of manufacture are provided to illustrate the method of FIG. 4. Although FIGS. 5-15, 16A-B, and 17A-C are described in relation to the method, it will be appreciated that the structures disclosed in FIGS. 5-15, 16A-B, and 17A-C are not limited to the method, but instead may stand alone as structures independent of the method. Similarly, although the method is described in relation to FIGS. 5-15, 16A-B, and 17A-C it will be appreciated that the method is not limited to the structures disclosed in FIGS. 5-15, 16A-B, and 17A-C but instead may stand alone independent of the structures disclosed in FIGS. 5-15, 16A-B, and 17A-C.

Figure 5:
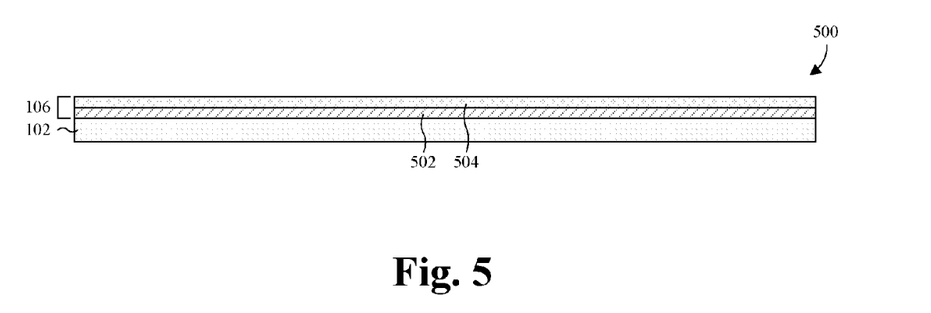
FIGS. 5-15, 16A-B, and 17A-C illustrate a series of cross-sectional views of some embodiments of a semiconductor structure at various stages of manufacture, the semiconductor structure having a multi-layer active layer having at least one partial recess.

FIG. 5 illustrates a cross-sectional view 500 of some embodiments corresponding to Act 402.

As illustrated by FIG. 5, a substrate 102 is provided. The substrate 102 typically has crystalline orientation of (111), but other orientations are amenable. Further, the substrate 102 may be, for example, a silicon carbide substrate, a silicon substrate, or a sapphire substrate, and/or may have, for example, a thickness of between about 800-2000 nanometers. Also illustrated, a seed layer 106 is formed over the substrate 102. The seed layer 106 is employed for growth of a subsequently formed layer, discussed hereafter, and a group III-V material, such as aluminum nitride. The seed layer 106 can be formed using any suitable deposition technique, such as metal-organic chemical vapor deposition (MOCVD).

In some embodiments, the process for forming the seed layer 106 includes: forming a first seed layer 502 over the substrate 102; and forming a second seed layer 504 arranged over the first seed layer 502. The first and second seed layers 502, 504 are typically formed of the same material, such as aluminum nitride, but at different temperatures. For example, the first seed layer 502 may be formed at about 700-1150 degrees Celsius, whereas the second seed layer 504 may be formed at in the same temperature range or in a different range. Further, the first seed layer 502 may be, for example, formed with a thickness of about 20-100 nanometers, and the second seed layer 504 may be, for example, formed with a thickness of about 50-200 nanometers.

Figure 6:
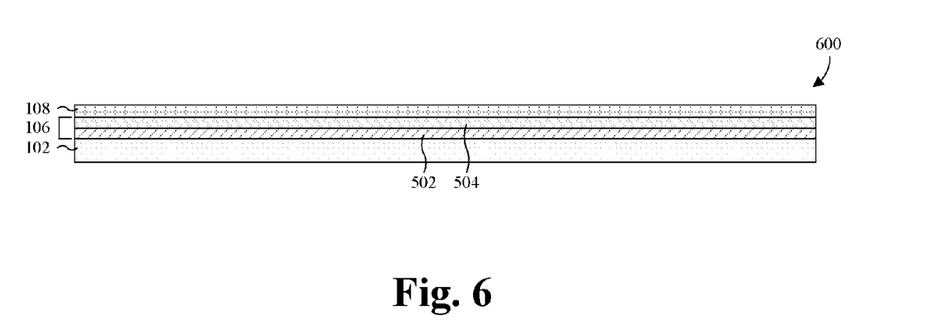

FIG. 6 illustrates a cross-sectional view 600 of some embodiments corresponding to Act 404.

As illustrated by FIG. 6, a graded buffer layer 108 is formed over the seed layer 106. The graded buffer layer 108 may be a III-V layer, with increasing or decreasing amounts of at least one element. For example, the graded buffer layer 108 typically includes a layer of AlGaN stacked with decreasing amounts of aluminum, and increasing amounts of gallium, away from the substrate 102.

The process for forming the graded buffer layer 108 may formed using any suitable deposition technique, such as MOCVD, molecular beam epitaxy (MBE), or hydride vapor phase epitaxy (HVPE). The graded buffer layer 108 are typically formed with a carbon concentration of greater than about 1e17 $cm^{-3}$. Further, the graded buffer layer 108 is typically formed at a temperature of about 1000-1150 degrees Celsius, and/or with a thickness of about 0.5-1.5 micrometers.

Figure 7:
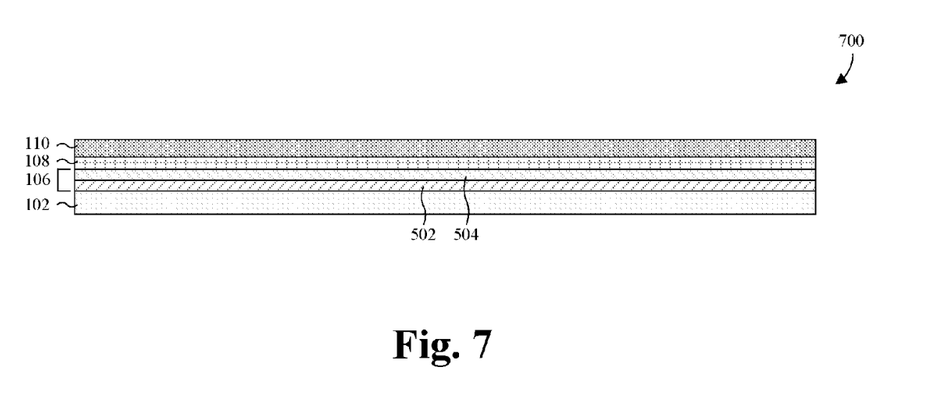

FIG. 7 illustrates cross-sectional view 700 of some embodiments corresponding to Act 406.

As illustrated by FIG. 7, a doped buffer layer 110 is formed over the graded buffer layer 108. The doped buffer layer 110 may be a III-V layer, with increasing or decreasing amounts of at least one element. For example, the doped buffer layer 110 is typically a layer of GaN. The doped buffer layer 110 is formed with a dopant. For example, the dopant may be a carbon concentration of greater than about 1e17 $cm^{-3}$. Further, the doped buffer layer 110 is typically formed at a temperature of about 900-1050 degrees Celsius, and/or with a thickness of about 0.5-2.5 micrometers.

Figure 8:
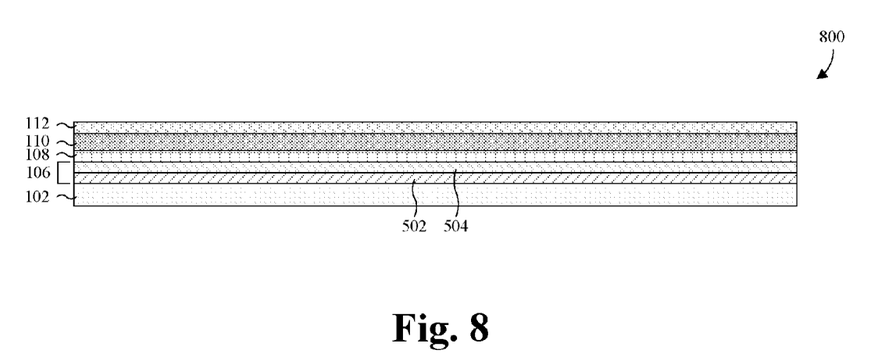

FIG. 8 illustrates cross-sectional view 800 of some embodiments corresponding to Act 408.

As illustrated by FIG. 8, a channel layer 112 is formed over the doped buffer layer 110. The channel layer 112 is typically an undoped group III-V layer, such as undoped GaN layer. The channel layer 112 may be formed using any suitable deposition technique, such as MOCVD, MBE, or HVPE, and is typically formed at about 950-1050 degrees Celsius under a pressure of 100 mbar to 650 mbar. Further, the channel layer 112 is typically formed with a thickness of about 0.2-0.6 micrometers.

Figure 9:
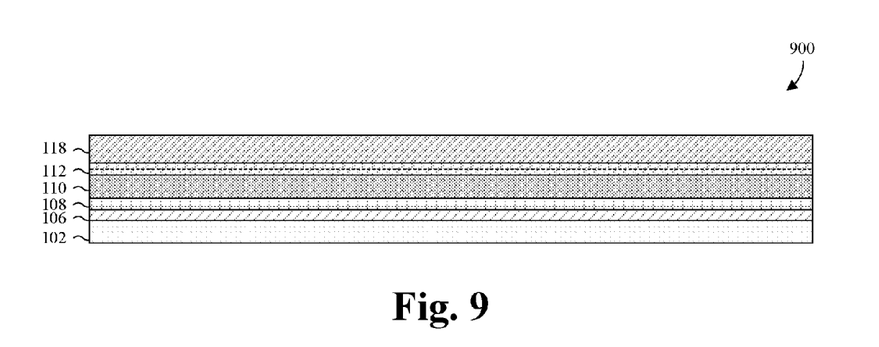

FIG. 9 illustrates cross-sectional view 900 of some embodiments corresponding to Act 410.

As illustrated by FIG. 9, a first active layer 118 is formed over the channel layer. In some embodiments, the process for forming the first active layer 118 includes forming a single group III-V layer over the channel layer 112. The single group III-V layer may be, for example, an AlGaN or InAlGaN layer, typically having a thickness of about 5-30 nanometers. The single group III-V layer may be formed using any suitable deposition technique, such as MOCVD, MBE, or HVPE, and is typically formed at a temperature of about 1000-1100 degrees Celsius, under a pressure of 50 mbar to 100 mbar.

The first active layer 118 may be an $Al_xGa_{1-x}N$ layer, having an x value that corresponds to the amount of aluminum relative to the total amount of aluminum and gallium. In one embodiment, x may be in a range of 0.1-0.2. The value x may be selected for specific field effects or based, at least in part, on the combined electrical effects of the first active layer 118 with a second active layer discussed below.

Figure 10:
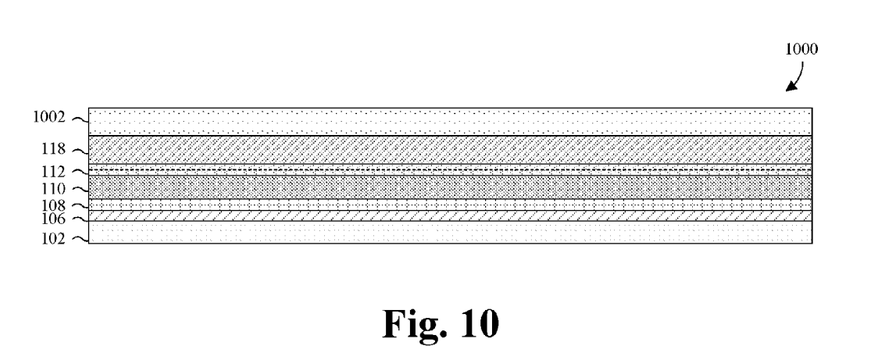

FIG. 10 illustrates cross-sectional view 1000 of some embodiments corresponding to Act 412.

As illustrated by FIG. 10, a dummy silicon oxide layer 1002 is deposited over the first active layer 118. The oxide layer 1002 is comprised of an oxide material (e.g., $SiO_2$). The oxide layer 1002 may be formed by way of a thermal process. In other embodiments, the oxide layer 1002 may be formed by way of a deposition process (e.g., chemical vapor deposition (CVD), physical vapor deposition (PVD), atomic layer deposition (ALD), etc.). The oxide layer 1002 may be approximately 10-50 nanometers thick.

Figure 11:
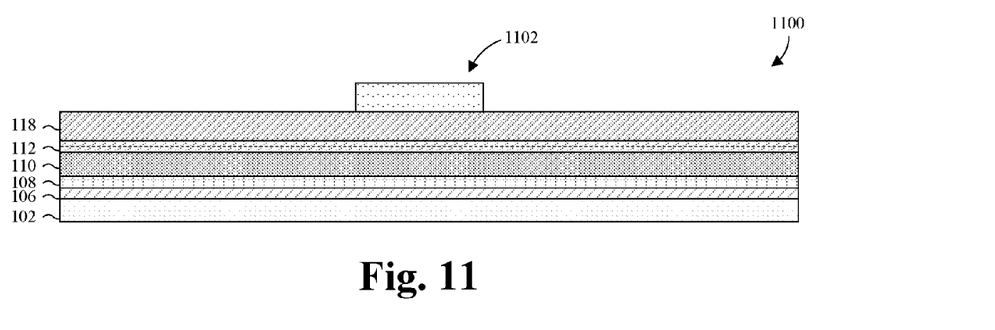

FIG. 11 illustrates cross-sectional view 1100 of some embodiments corresponding to Act 414.

As illustrated by FIG. 11, the oxide layer 1002 is etched according to a first masking layer (not shown) to form an oxide section 1102. In various embodiments, the first masking layer may comprise photoresist or a nitride (e.g., $Si_3N_4$) patterned using a photolithography process. In various embodiments, the etchant may comprise a dry etchant have an etching chemistry comprising a fluorine species (e.g., $CF_4$, $CHF_3$, $C_4F_8$, etc.) or a wet etchant (e.g., hydrofluoric acid (HF), Buffered Oxide Etch (BOE) solution, or Tetramethylammonium hydroxide (TMAH)).

Figure 12:
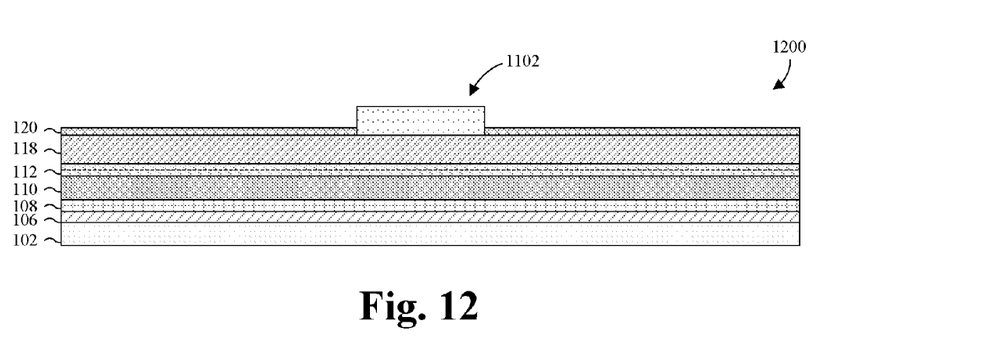

FIG. 12 illustrates cross-sectional view 1000 of some embodiments corresponding to Act 416.

As illustrated by FIG. 12, a second active layer 120 is formed over the first active layer 118 on either side of the oxide section 1102. In some embodiments, the process for forming the second active layer 120 includes forming a single group III-V layer over the first active layer 118. The single group III-V layer may be, for example, an AlGaN or InAlGaN layer, typically having a thickness of about 2-10 nanometers. In some embodiments, the second active layer 120 is thinner that the first active layer 118. The second active layer 120 may be thinner because the second active layer 120 has a lower resistance. Accordingly, the first active layer 118 is thicker to accommodate current flow since it has a higher resistance than the second active layer 120. The single group III-V layer may be formed using any suitable deposition technique, such as MOCVD, MBE, or HVPE.

The second active layer 120 may be an $Al_yGa_{1-y}N$ layer, having an y value that corresponds to the amount of aluminum relative to the total amount of aluminum and gallium. In one embodiment, y may be in a range of 0.2-0.5. The value y may be selected for specific field effects or based, at least in part, on the combined electrical effects of the second active layer 120 with the first active layer 118. The second active layer 120 may have a thickness ranging from 2-10 nanometers in some embodiments.

FIGS. 10, 11, and 12 describe using a dummy oxide layer create a second active layer 120 having a recess where the oxide section 1102 was formed. However, in some embodiments these steps may be replaced by instead forming the second active layer 120 and etching the second active layer 120 to form a recess corresponding to the recess where the oxide sections 1102 was formed. In this embodiment, not shown, the second active layer may be etched using dry and/or wet etch.

Figure 13:
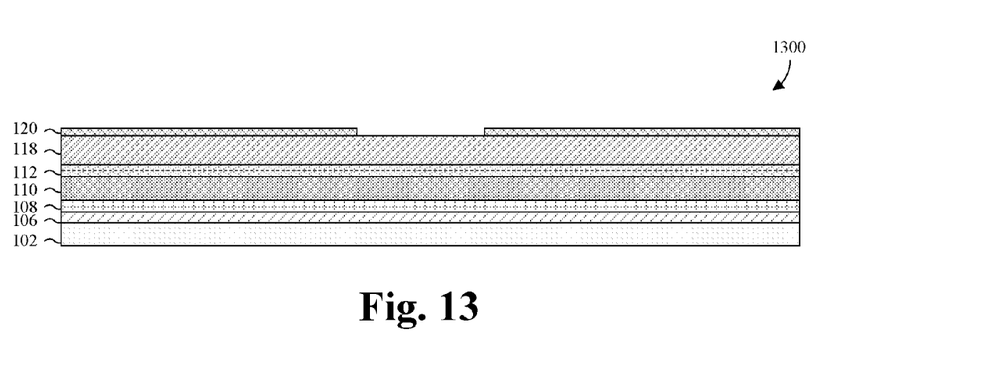

FIG. 13 illustrates cross-sectional view 1300 of some embodiments corresponding to Act 418.

As illustrated by FIG. 13, the oxide section 1102 is etched to remove the oxide section 1102. In various embodiments, the etchant may comprise a wet etchant. For example, the oxide section 1102 may be removed with dilute hydrofluoric acid (DHF) or phosphoric acid ($H_3PO_4$)

Figure 14:
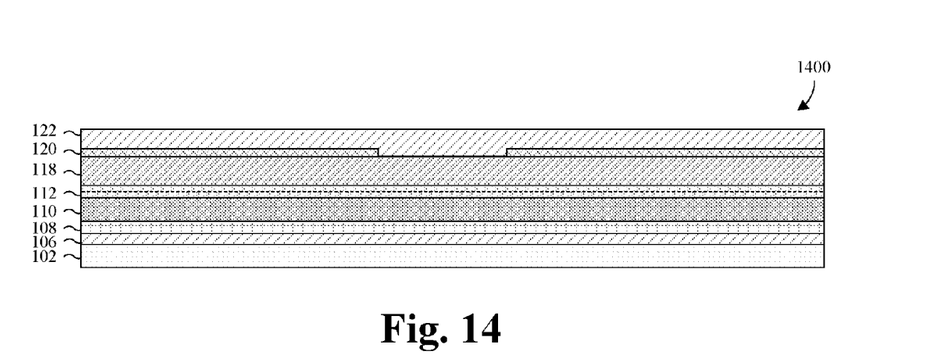

FIG. 14 illustrates cross-sectional view 1400 of some embodiments corresponding to Act 420.

As illustrated by FIG. 14, a dielectric layer 122 is formed over the plurality of active layers 116. The dielectric layer 122 may be formed using any suitable deposition technique, such as chemical vapor deposition (CVD) or physical vapor deposition (PVD). The dielectric layer 122 may be formed as, for example, an oxide, such as silicon dioxide or a combination of silicon nitride and silicon dioxide. The dielectric layer 122 may be approximately 5-200 nanometers.

Figure 15:
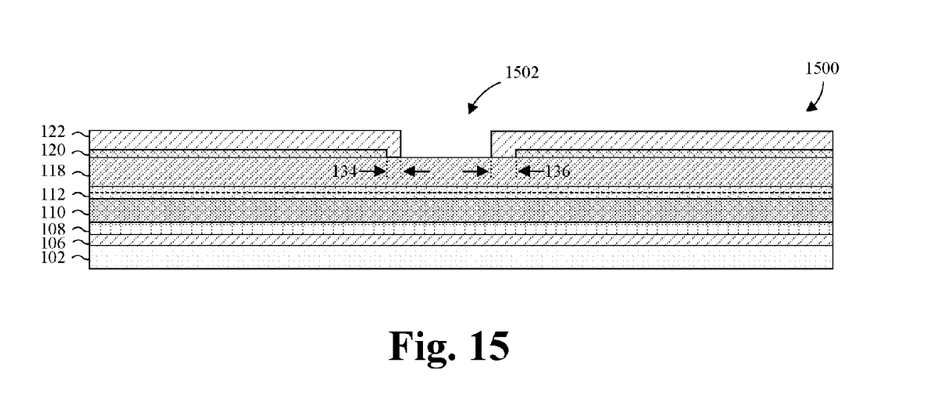

FIG. 15 illustrates cross-sectional view 1500 of some embodiments corresponding to Act 422.

As illustrated by FIG. 15, the dielectric layer 122 is etched to form a gate opening 1502. The gate opening 1502 is etched into the dielectric layer 122 so that recesses may be formed on either side of the gate opening 1502. For example, the first recess 134 may for formed on a first side 1504 of the device between a vertical surface of the second active layer 120 proximate to the gate opening 1502 and the gate opening 1502 itself. Likewise, the second recess 136 may for formed on a second side 1506 of the device between a vertical surface of the second active layer 120 proximate to the gate opening 1502 and the gate opening 1502 itself.

Figure 16A:
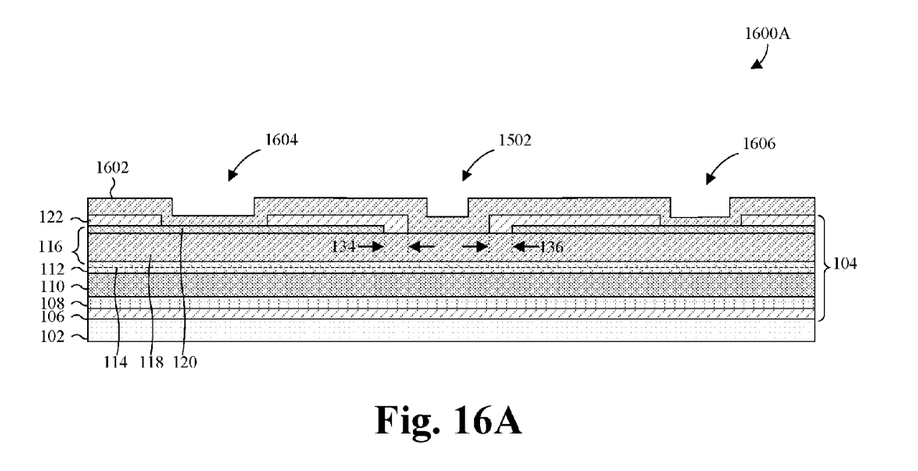
Figure 16B:
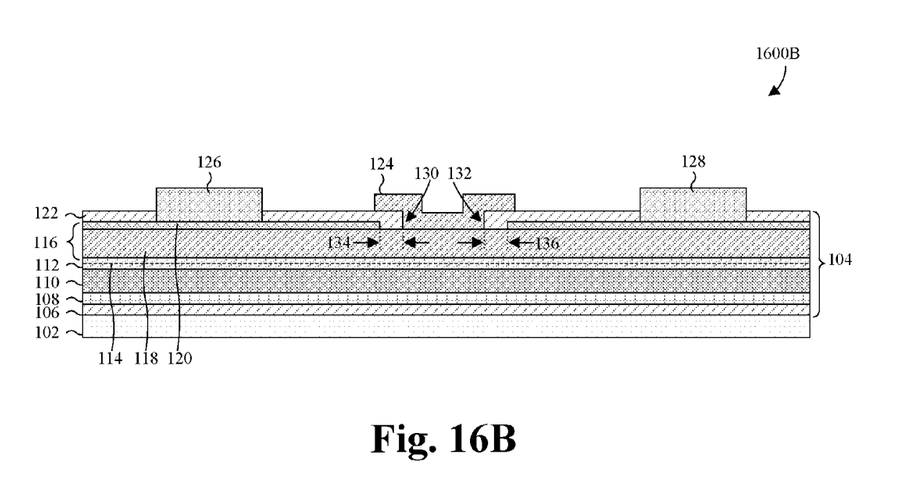

FIGS. 16A-B illustrate cross-sectional views 1600A-B of other embodiments corresponding to Acts 424, which may be used to form an D-HEMT (e.g., as shown by one example in FIG. 1).

As illustrated by FIG. 16A, a conductive layer 1602 is formed over the dielectric layer 122. In addition to filling the gate opening 1502 as shown, the source/drain openings 1604, 1606 are also filled. The conductive layer 1602 may be, for example, a metal, such as titanium nitride, copper, or doped polysilicon.

As illustrated by FIG. 16B, an electrode etch is performed to the second active layer 120, through regions of the conductive layer 1602 surrounding source/drain regions and the gate region. The electrode etch results in the gate electrode 124 source/drain electrodes 126, 128. In some embodiments, the process for performing the electrode etch includes: forming a photoresist layer (not shown) masking regions of the conductive layer 1602 surrounding the source/drain regions; applying an etchant according to the photoresist layer, and removing the photoresist layer.

Figure 17A:
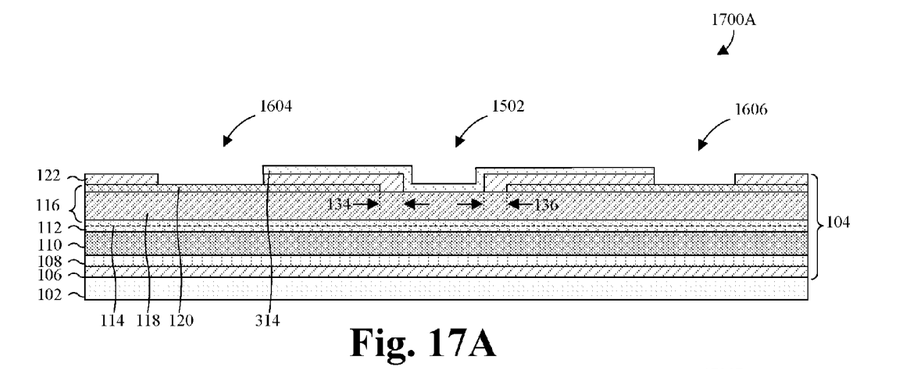
Figure 17B:
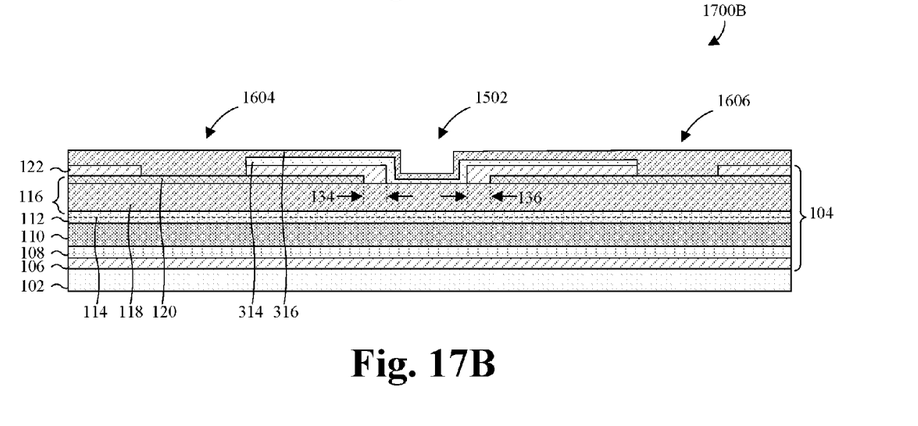
Figure 17C:
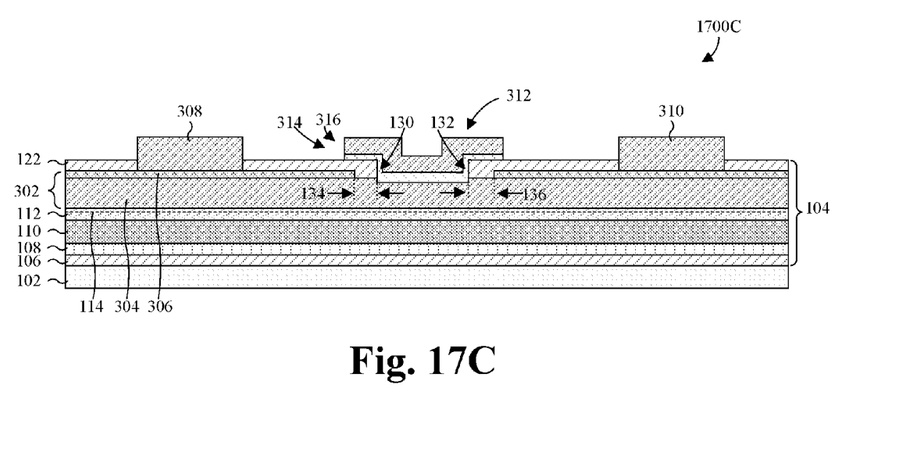

FIGS. 17A-C illustrate cross-sectional views 1700A-C of some embodiments also corresponding to Act 424, which may be used to form an D-MISFET (e.g., as shown by one example in FIG. 3).

As illustrated by FIG. 17A, a passivation layer 314 is formed over the second active layer 120. The passivation layer 314 may be formed using any suitable deposition technique, such as chemical vapor deposition (CVD) or physical vapor deposition (PVD). The passivation layer 314 may be formed using an insulator, such as silicon nitride.

As illustrated by FIG. 17B, a gate conductive layer 316 is formed over the passivation layer 314. In addition to filling the gate opening 1502 as shown, the source/drain openings (not shown) are also filled. The gate conductive layer 316 may be, for example, a metal, such as titanium nitride, copper, or doped polysilicon.

As illustrated by FIG. 17C, an electrode etch is performed to the second active layer 120, through regions of the gate conductive layer 316 surrounding source/drain regions and the gate region. The electrode etch results in the gate electrode 124 source/drain electrodes 126, 128. In some embodiments, the process for performing the electrode etch includes: forming a photoresist layer (not shown) masking regions of the gate conductive layer 316 surrounding the source/drain regions; applying an etchant according to the photoresist layer, which is preferential of the gate conductive layer 316 relative to the plurality of active layers 116, and removing the photoresist layer.

Figure 18A:
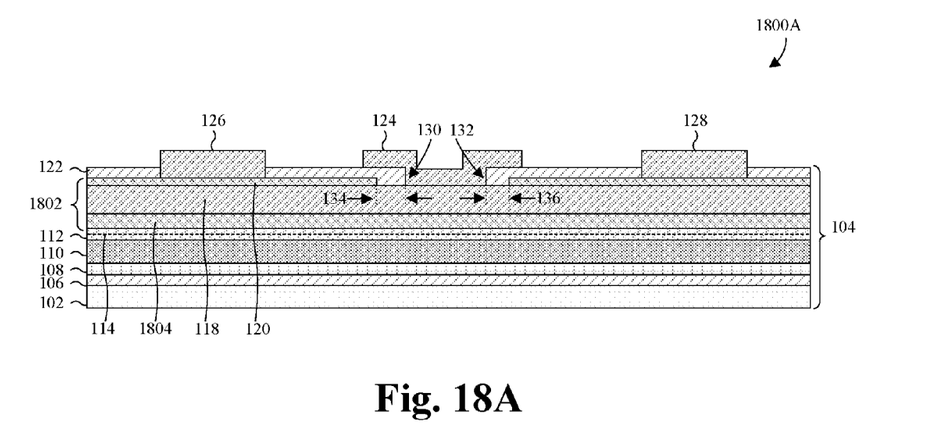

FIG. 18A is a cross-sectional view 1800 of some additional embodiments of a D-HEMT. As shown the plurality of active layers 116 may include a first active layer 118 and a second active layer 120. However, as discussed above, more active layers may be used in the plurality of active layers 116. The D-HEMT includes a similar structure as the D-HEMT of FIG. 1, except it includes a different plurality of active layers 1802. In particular, the plurality of active layer 1802 includes three active layers.

A third active layer 1804 is arranged between the channel layer 112 and the first active layer. The third active layer 1804 has a similar composition as the first active layer 118 and a second active layer 120. The first active layer 118 is an $Al_xGa_{1-x}N$ layer, where x corresponds to the amount of aluminum relative to the total amount of aluminum and gallium. The second active layer 120 is an $Al_yGa_{1-y}N$ layer, where y corresponds to the amount of aluminum relative to the total amount of aluminum and gallium. The third active layer 1804 is an $Al_zGa_{1-z}N$ layer, where z corresponds to the amount of aluminum relative to the total amount of aluminum and gallium. The values of x, y, and z are selected based on the desired combined electrical effects of the plurality of 1802 as a whole. In some embodiments, the values of x, y, and z may be different values, or one or more of x, y, and z values may have the same value. In some embodiments, the third active layer 1804 may be thicker than the second active layer, but thinner that the first active layer 118. The third active layer 1804 may be selected to compliment the electrical effects of the first and second active layers 118, 120.

Figure 18B:
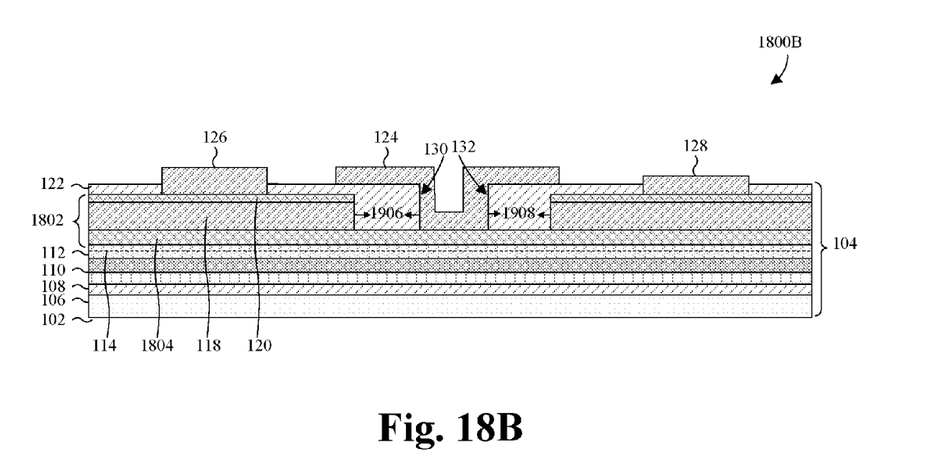

FIG. 18B, is a cross-sectional view 1800 of some additional embodiments of a D-HEMT. The D-HEMT includes a similar structure as the D-HEMT of FIG. 18A, except that the gate electrode 124 is laterally separated from both the first active layer 118 and the second active layer. Accordingly, the recesses 1806 and 1808 extend through both the first active layer and the second active layer 120. Furthermore, a bottom surface of the gate electrode 124 abuts the top surface of the third active layer 1804. In some embodiments, the sidewall of the recesses 1806 and 1808 adjacent the first and second active layer 118, 120 is not planar. Instead, the first active layer 118 may be a greater distance from the gate electrode 124 than the second active layer 120.

The improved GaN transistor described includes an epitaxial stack having multiple active layers stacked between the channel layer and the dielectric layer. The active layers may include, for example, AlGaN layers having different concentrations of Al relative to the combined amount of Al and Ga. By using multiple active layers, the GaN transistor benefits from the advantages individual active layers as the layers function collectively. Furthermore, the benefits of one active layer mitigate the disadvantages of another active layer. Accordingly, the active layers can be strategically selected to generate particular electric field effects. Moreover, because a plurality of active layers are used, one or more of the active layers can be recessed such that the one or more active layers do not directly abut the device electrodes there by reducing gate edge failure.

Thus, as can be appreciated from above, the present disclosure provides a transistor. The transistor includes a channel layer arranged over a substrate. The channel layer has a first bandgap. The transistor includes a first active layer arranged over the channel layer. The first active layer has a second bandgap different from the first band gap such that the first active layer and the channel layer meet at a heterojunction. The transistor includes a second active layer arranged over the first active layer. The transistor also includes a dielectric layer arranged over the second active layer. The transistor further includes gate electrode having gate edges that are laterally adjacent to the dielectric layer. At least one gate edge of the gate edges is laterally separated from the second active layer by a first recess.

The present application further provides a method for manufacturing a transistor. The method includes forming a channel layer over a substrate. A plurality of active layers is formed over the channel layer. The plurality of active layers includes a first active layer and a second active layer arranged over the first active layer. The method also includes forming a dielectric layer over the plurality of active layers. A gate conductive layer having gate conductive edges that are laterally adjacent to the dielectric layer is formed. At least one gate conductive edge of the gate conductive edges is laterally separated from the second active layer by a first recess.

In some embodiments a transistor comprising a silicon substrate is provided. The transistor further includes a plurality of buffer layers arranged over the silicon substrate. The plurality of buffer layers include layers of aluminum nitride (AlN), aluminum gallium nitride (AlGaN), and gallium nitride (GaN) doped with carbon or iron. The transistor also includes a channel layer of undoped GaN arranged over the plurality of buffer layers. The transistor also includes a plurality of active layers source region and a drain region arranged over and directly abutting the channel layer. The plurality of active layers are comprised of aluminum gallium nitride (AlGaN) having different concentrations of aluminum (Al). The source and drain regions are made of conductive material and spaced apart from one another. A first active layer of the plurality of active layer is comprised of $Al_xGa_{1-x}N$. The first active layer is arranged over the channel layer and extends continuously between the plurality of active layers that collectively define the source region and the drain region. The first active layer is in direct contact with the channel layer, meeting the channel layer at a heterojunction. The x value ranges from 0.1 to 0.2. The transistor also includes a gate electrode arranged over the first active layer at a position between the source region and drain region. The gate electrode includes a lower gate electrode portion and upper gate electrode portion which extend laterally from an uppermost portion of the lower gate electrode portion. The second active layer of the plurality of active layers is comprised of $Al_yGa_{1-y}N$ and is arranged over the first active layer and on opposite sides of the lower gate electrode portion without extending under the lower gate electrode portion. The y value ranges from 0.2 to 0.5.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
    a channel layer arranged over a substrate, the channel layer having a first bandgap;
    a first active layer arranged over the channel layer, the first active layer having a second bandgap different from the first bandgap such that the first active layer and channel layer meet at a heterojunction;
    a second active layer arranged over the first active layer;

a dielectric layer arranged over the second active layer; and a gate electrode having gate edges, wherein at least one gate edge of the gate edges is laterally separated from the second active layer by a portion of the dielectric layer that abuts a top surface of the first active layer.

2. The transistor of claim 1, wherein the first active layer has first concentration of elements common to the first active layer and the second active layer has a second concentration of the elements common to the second active layer, and wherein the first concentration and the second concentration are different.

3. The transistor of claim 1, wherein the first active layer is thicker than the second active layer.

4. The transistor of claim 1, wherein the at least one gate edge is a first gate edge separated from the second active layer by a first recess having a first distance, and wherein the gate edges also include a second gate edge laterally separated from the second active layer by a second recess having a second distance.

5. The transistor of claim 4, further comprising
a source electrode; and
a drain electrode laterally separated from the source electrode by the gate electrode, wherein the first distance is located between the gate electrode and the drain, and wherein the second distance is located between the source electrode and the gate electrode.

6. The transistor of claim 4, further comprising:
a passivation layer arranged between the first active layer and a gate conductive layer of the gate electrode.

7. The transistor of claim 6, wherein the passivation layer has a passivation layer bottom surface that abuts a top surface of the first active layer.

8. The transistor of claim 6, wherein the passivation layer is comprised of an insulating material.

9. The transistor of claim 1, further comprising:
wherein the first active layer and the second active layer are aluminum gallium nitride (AlGaN) layers, and wherein the first active layer and the second active layer have a different concentration aluminum (Al) relative to a combined amount of aluminum and gallium (AlGa).

10. A method for manufacturing a transistor, said method comprising:
forming a channel layer over a substrate;
forming a plurality of active layers over the channel layer including a first active layer and a second active layer arranged over the first active layer;
forming a dielectric layer over the plurality of active layers;
forming a passivation layer arranged over the first active layer, wherein the passivation layer has a passivation layer bottom surface that abuts a top surface of the first active layer; and
forming a gate conductive layer having gate conductive edges that are laterally adjacent to the dielectric layer, wherein at least one gate conductive edge of the gate conductive edges is laterally separated from the second active layer by a first recess.

11. The method of claim 10, wherein the plurality of active layers are aluminum gallium nitride (AlGaN) layers, and wherein each of the plurality of active layers has a different concentration aluminum (Al) relative to a combined amount of aluminum and gallium (AlGa) than other active layers in the plurality of active layers.

12. The method of claim 11, wherein the second active layer has a higher concentration of Al relative to the combined amount of Al and Ga than the first active layer.

13. The method of claim 10, wherein first active layer is thicker than the second active layer.

14. The method of claim 10, further comprising
forming a seed layer over the substrate;
forming a graded buffer layer over the seed layer; and
forming a doped buffer layer over the graded buffer layer and under the channel layer.

15. The method of claim 10, wherein the at least one gate conductive edge is a first gate conductive edge and the first recess has a first distance, and wherein the gate conductive edges include a second gate conductive edge laterally separated from the second active layer by a second recess having a second distance.

16. The method of claim 15, wherein the first distance is greater than the second distance.

17. The method of claim 15, further comprising
forming a source electrode from the gate conductive layer;
forming a gate electrode from the gate conductive layer; and
forming a drain electrode from the gate conductive layer, wherein the drain electrode is laterally separated from the source electrode by the gate electrode, wherein the first distance is located between the gate electrode and the drain electrode, and wherein the second distance is located between the source electrode and the gate electrode.

18. The method of claim 10, further comprising:
depositing an oxide layer over the first active layer;
etching the oxide layer to form at least one oxide section, wherein the second active layer is formed on either side of the oxide section; and
performing an etch to remove the oxide section.

19. A transistor comprising:
a silicon substrate;
a plurality of buffer layers arranged over the silicon substrate, wherein the plurality of buffer layers include layers of aluminum nitride (AlN), aluminum gallium nitride (AlGaN), and gallium nitride (GaN) doped with carbon or iron;
a channel layer of undoped GaN arranged over the plurality of buffer layers;
a source region and a drain region arranged over the channel layer, the source and drain regions being made of conductive material and spaced apart from one another; first active layer of $Al_xGa_{1-x}N$ arranged over the channel layer and extending continuously between the source region and drain region, the first active layer in direct contact with the channel layer and meeting the channel layer at a heterojunction, wherein x ranges from 0.1 to 0.2;
a gate electrode arranged over the first active layer at a position between the source region and drain region, the gate electrode including a lower gate electrode portion and upper gate electrode portion which extend laterally from an uppermost portion of the lower gate electrode portion; and
a second active layer of $Al_yGa_{1-y}N$ arranged over the first active layer and on opposite sides of the lower gate electrode portion without extending under the lower gate electrode portion, wherein y ranges from 0.2 to 0.5.

20. The transistor of claim 19, further comprising:
a dielectric layer arranged over the second active layer and separating the second active layer from the gate electrode;
wherein the dielectric layer separates the second active layer from a first edge of the gate electrode nearest the source region by a first distance and separates the second active layer from a second edge of the gate electrode nearest the drain region by a second distance, the second distance being greater than the first distance.

* * * * *